United States Patent
Sin

[11] Patent Number: 6,115,289
[45] Date of Patent: Sep. 5, 2000

[54] FLASH MEMORY DEVICE

[75] Inventor: Tae-Seung Sin, Cheongju, Rep. of Korea

[73] Assignee: LG Semicon Co., Ltd., Chungcheongbuk-Do, Rep. of Korea

[21] Appl. No.: 09/288,106

[22] Filed: Apr. 8, 1999

[30] Foreign Application Priority Data

Sep. 9, 1998 [KR] Rep. of Korea .................... 98-37135

[51] Int. Cl.⁷ .................................................. G11C 16/06
[52] U.S. Cl. ................... 365/185.23; 365/189.05; 365/189.02
[58] Field of Search ............. 365/185.23, 189.05, 365/189.02

[56] References Cited

U.S. PATENT DOCUMENTS 5,835,446  11/1998  Park ........................... 365/189.05 X
5,862,099   1/1999  Gannage et al. ............. 365/185.23 X

*Primary Examiner*—Huan Hoang
*Attorney, Agent, or Firm*—Morgan, Lewis & Bockius LLP

[57] ABSTRACT

A flash memory device of the present invention increases a speed of reading data. The conventional art has a problem of losing data due to data collision when increasing the data reading speed by making an operation of an external clock signal fast. However, the flash memory device of the present invention has an advantage of preventing the data loss even in a fast data reading operation by using a temporary buffer and an output control signal for outputting data in the data reading operation.

5 Claims, 4 Drawing Sheets

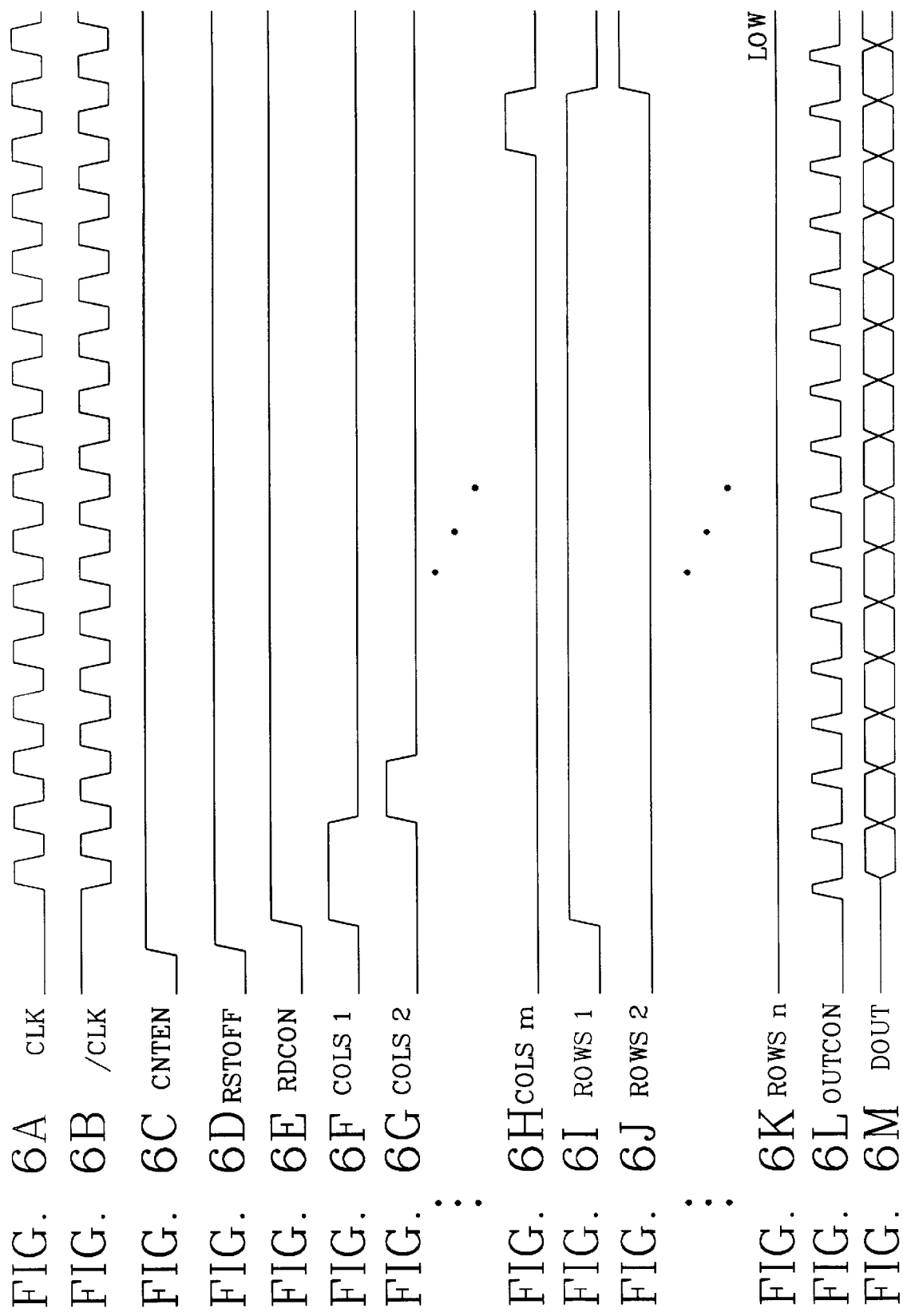

FLASH MEMORY DEVICE

BACKGROUND OF THE INVENTION

1. Field of the Invention

The present invention relates to a flash memory device which improves a speed of reading data of a mass storage flash memory, and more particularly to a flash memory device that solves a problem of losing data due to data collision even in the fast data reading operation.

2. Description of the Conventional Art

FIG. 1 illustrates a conventional flash memory which includes a memory array 1 consisting of a plurality of flash memory cells, a sense amp unit 2 amplifying data stored in a selected cell of the memory array 1 or amplifying externally inputted data to store in a selected cell, a data buffer 3 storing the data amplified by the sense amp unit 2 or storing the externally inputted data, an input/output buffer 4 storing data or an address inputted through an input/output pad or storing data from the data buffer 3, a row buffer 5 storing row addresses among addresses inputted through the input/output buffer 4, a row decoder 6 decoding the row addresses which are inputted to the row buffer 5 and thus selecting word lines of the memory array 1, a column decoder 7 decoding column addresses among the addresses inputted through the input/output buffer 4 and thus selecting bit lines of the memory array 1, and a control unit 8 controlling each of the above blocks.

FIG. 2 is a detailed block diagram of the control unit 8. As shown therein, the control unit 8 includes a first counter 8a performing up-counting to connect the m number of column lines to the data buffer 3 by being synchronized with an external clock signal CLK, a second counter 8b synchronized with the external clock signal CLK and receiving a carry of the first counter for thereby performing the up-counting to select the n number of word lines of the data buffer 3, a counter control unit 8e receiving the external clock signal CLK and a counter enable signal CNTEN and controlling the first and second counters 8a, 8b, a first decoder 8c receiving an output from the first counter 8a and connecting the m number of the column lines to the data buffer 3, and a second decoder 8d receiving an output from the second counter 8b and selecting the n number of the row lines of the data buffer 3.

The operation of such conventional flash memory will be described with reference to the accompanying drawings. In order to promptly operate the mass storage flash which synchronizes the input/output of the data to the external clock signal CLK, the data buffer 3 is connected between the memory array 1 and the input/output buffer 4, the data buffer 3 storing information of one word line of the memory array 1.

In a read mode, a word line of the memory array 1 which is to be read is selected and data stored in a cell connected to the selected word line are amplified by the sense amp unit 2 and stored in the data buffer 3 which is then synchronized with the external clock CLK and outputs the data stored therein to an external circuit through the input/output buffer 4.

Referring to FIG. 3, the process of reading data of the memory array 1 will be explained in detail.

First, the sense amp unit 2 amplifies the data stored in cells of the memory array 1 and transmits the data to the data buffer 3. Then, the counter enable signal CNTEN at a high level, as shown in FIG. 3B, is applied to he counter control unit 8e, and after a predetermined time which is about 100 $\mu s$ the external clock CLK shown in FIG. 3A is applied thereto. Accordingly, the counter control unit 8e outputs a reset-off signal RSTOFF as in FIG. 3C at the point where the external clock CLK is applied, for thereby enabling the first and second counters 8a, 8b, and the first decoder 8c sequentially outputs column selection signals, as shown in FIGS. 3D, 3E and 3F to the data buffer 3 in accordance with a signal outputted from the first counter 8a.

Here, the reset-off signal RSTOFF is outputted from the counter control unit 8e and the second decoder 8d enables the row selection signal at the high level, as shown in FIG. 3G, and then enables the next row selection signal as in FIG. 3H when the read operation of the data buffer 3 is completely finished. That is, while a first row of the data buffer 3 is selected by the row selection signal shown in FIG. 3G, the first decoder 8c sequentially outputs the column selection signals, as shown in FIGS. D, E and F, thereby externally outputting the data shown in FIG. 3J. Then, as shown in FIG. H, after a second row is selected, the first decoder 8c sequentially outputs the column selection signals by the above described operation, thereby suceedingly outputting the data of the data buffer 3. Thus, the data of the data buffer 3 are synchronized with the external clock CLK, thus performing the reading operation.

However, in the conventional art, since data which are stored in the data buffer are read and outputted by being synchronized with the external clock signal, there is a limit to increase the speed of reading data unless making the external clock signal fast, which may have a problem of losing the data due to the data collision.

SUMMARY OF THE INVENTION

Accordingly, the present invention is directed to a flash memory device which obviates the problems and disadvantages due to the conventional art.

An object of the present invention is to provide a flash memory device that stably performs a reading operation not to lose data even in the swift reading operation.

To achieve these and other advantages and in accordance with the purpose of the present invention, as embodied and broadly described, there is provided a flash memory device including a memory array consisting of a plurality of flash memory cells; a sense amp unit amplifying data which are stored in a selected cell of the memory array or amplifying data which are externally applied for storing the data in a selected cell; a data buffer storing the data amplified by the sense amp unit or storing the externally applied data; a temporary buffer receiving and temporarily storing the data which are stored in the data buffer; an input/output buffer storing data or addresses inputted through input/output pads or receiving and storing data stored in the temporary buffer; a row buffer receiving and storing row addresses among addresses inputted through the input/output buffer; a row decoder decoding the row addresses which are inputted to the row buffer for thereby selecting a word line of the memory array; a column decoder decoding column addresses among addresses inputted through the input/output buffer for thereby selecting a bit line of the memory array; and a control unit controlling each of the above blocks.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 6A through 6M are operation timing diagrams of the control unit in FIG. 5.

DETAILED DESCRIPTION OF THE INVENTION

Reference will now be made in detail to the preferred embodiment of the present invention, examples of which are illustrated in the accompanying drawings.

Figure 1:
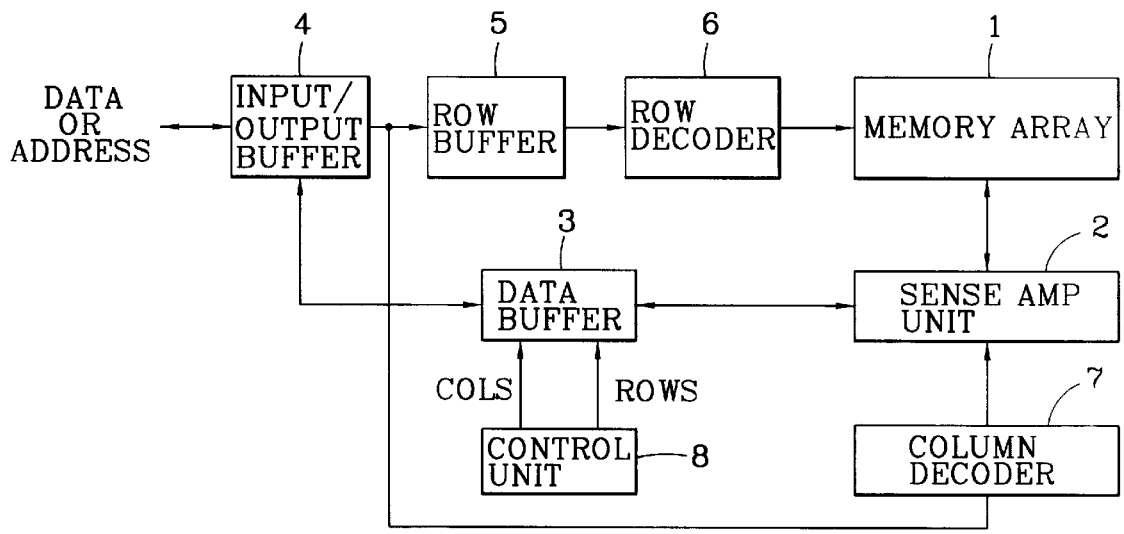
FIG. 1 is a block diagram of a conventional flash memory device.
Figure 2:
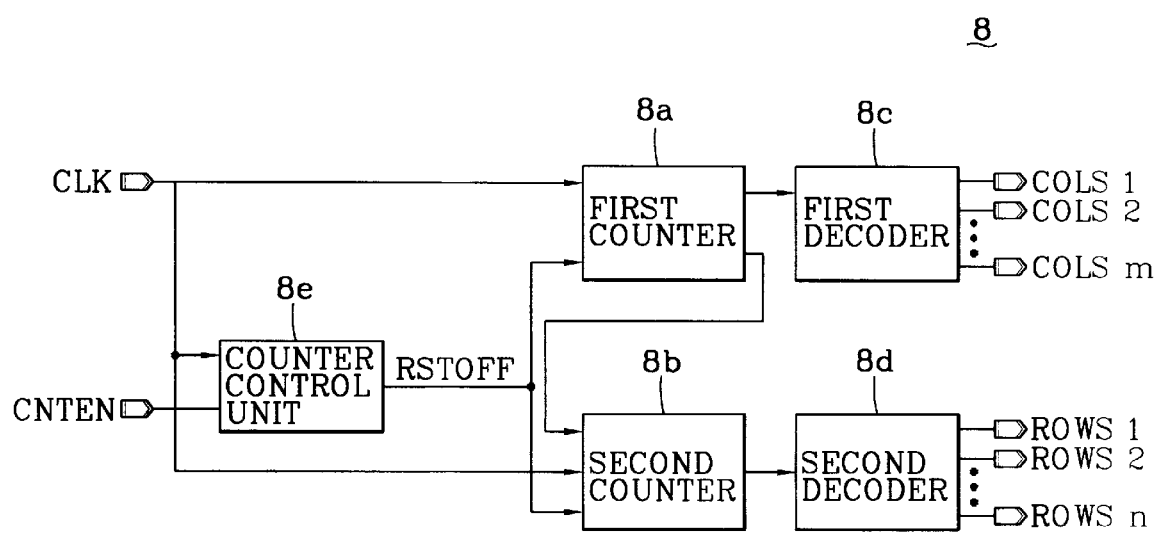
FIG. 2 is a detailed block diagram of a control unit in FIG. 1.
Figure 3:
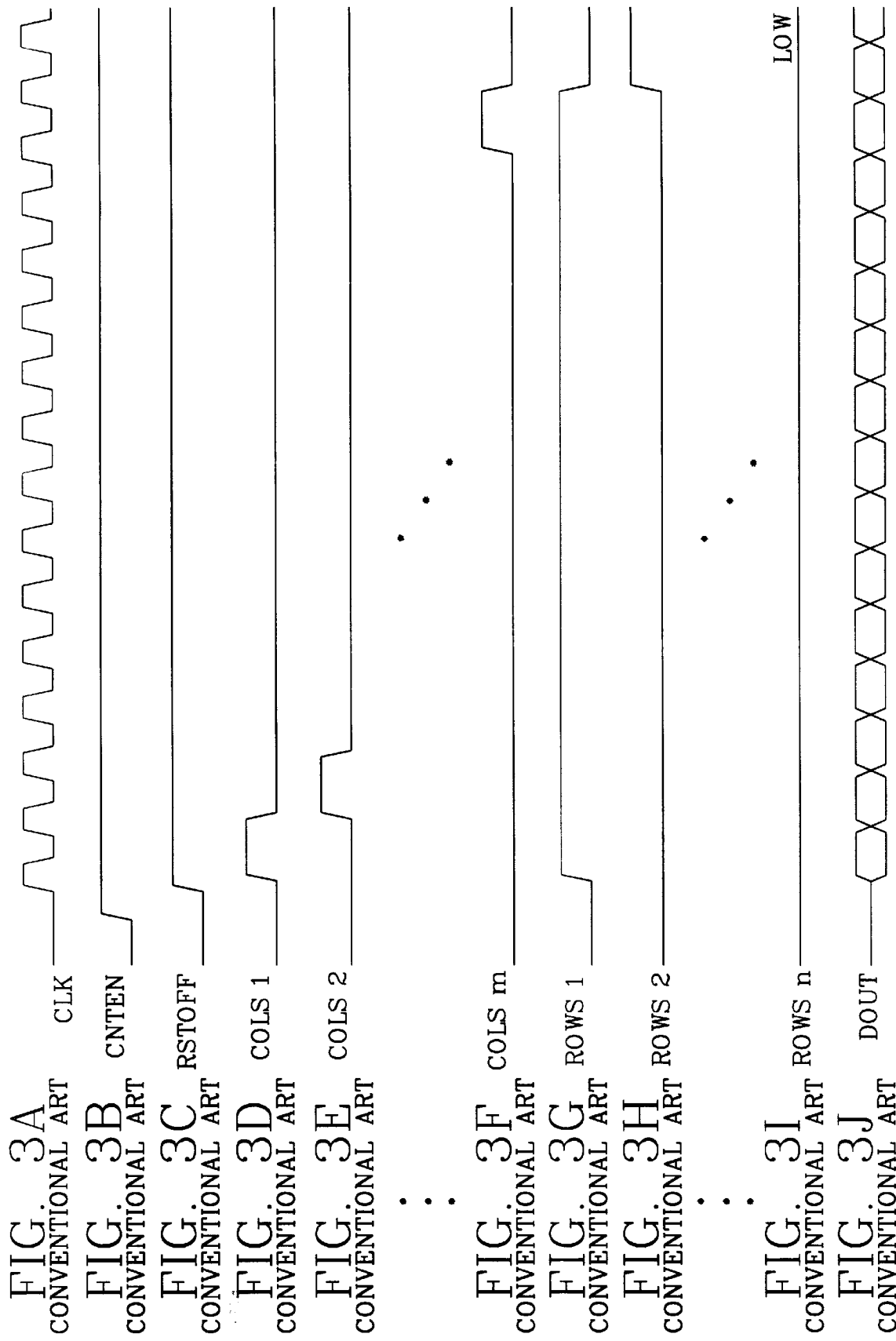
FIGS. 3A through 3J are operation timing diagrams of the control unit in FIG. 2.
Figure 4:
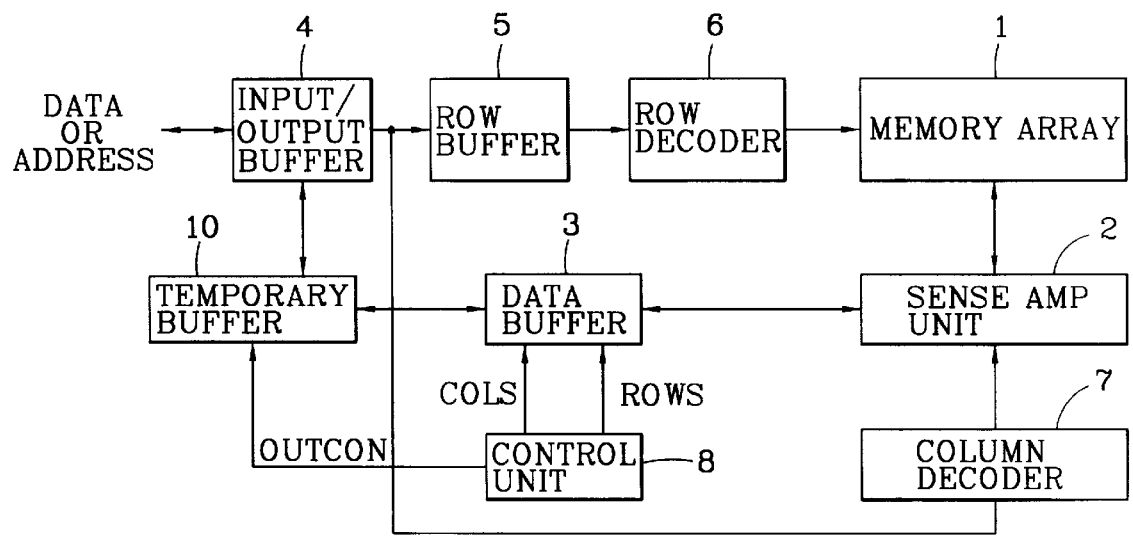
FIG. 4 is a block diagram of a flash memory device according to the present invention.
Figure 5:
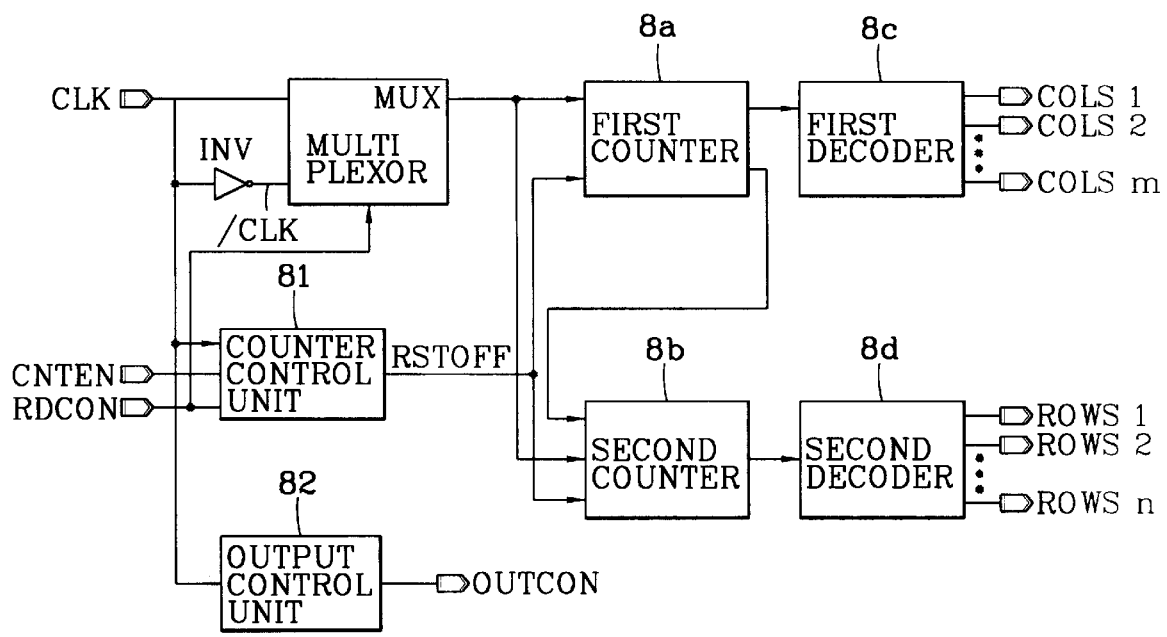
FIG. 5 is a detailed block diagram of a control unit in FIG. 4.

FIG. 4 illustrates a configuration of a flash memory device according to the present invention. As shown therein, the flash memory device includes a memory array 1 consisting of a plurality of flash memory cells, a sense amp unit 2 amplifying data which are stored in a selected cell of the memory array 1 or amplifying data which are externally applied for storing the data in a selected cell, a data buffer 3 storing the data amplified by the sense amp unit 2 or storing the externally applied data, a temporary buffer 10 receiving and temporarily storing the data which are stored in the data buffer 3, an input/output buffer 4 storing data or addresses inputted through input/output pads or receiving and storing data stored in the temporary buffer 10, a row buffer 5 receiving and storing row addresses among addresses inputted through the input/output buffer 4, a row decoder 6 decoding the row addresses which are inputted to the row buffer 5 for thereby selecting a word line of the memory array 1, a column decoder 7 decoding column addresses among addresses inputted through the input/output buffer 4 for thereby selecting a bit line of the memory array 1, and a control unit 8 controlling each of the above blocks.

More specifically, the control unit 8 consists of a first counter 8a synchronized with an external clock signal CLK and thereby performing up-counting to connect the m number of column lines, a second counter 8b synchronized with the external clock signal CLK and receiving a carry of the first counter 8a and thus performing up-counting in order to select the n number of row lines of the data buffer 3, a counter control unit 81 receiving the external clock signal CLK, a counter enable signal CNTEN and a read control signal RDCON and controlling the first and second counters 8a, 8b, a first decoder 8c receiving an output from the first counter 8a and connecting the m number of the column lines to the data buffer 3, a second decoder 8d receiving an output from the second counter 8b and thereby selecting the n number of row lines of the data buffer 3, an inverter INV inverting the external clock signal CLK to change a phase thereof, a multiplexor MUX selectively outputting the external clock signal CLK and an inversion clock signal /CLK, an inverted signal of the external clock signal CLK, and an output control unit 82 outputting an output control signal OUTCON for latching the data stored in the data buffer 3 at a point where the external clock signal CLK becomes a high level and thus the data are outputted.

Here, the elements which have the same construction are labelled with the same reference numbers as in the conventional art.

Now, the operation of the flash memory device according to the embodiment of the present invention will be described with the reference to the accompanying drawings.

First, the data stored in a selected cell of the memory array 1 are amplified by the sense amp unit 2 and then stored in the data buffer 3, identically to a buffer circuit for increasing a reading speed of a flash memory of the conventional art. Under such condition, when the counter enable signal CNTEN shown in FIG. 6C is enabled at a high level and applied to the counter control unit 81, the counter control unit 81 outputs a reset-off signal RSTOFF shown in FIG. 6D, for thereby resetting the first and second counters 8a, 8b. As this time, the read control signal RDCON is set as the high level as shown in FIG. 6E.

When the above described process is completed, the external signal CLK as shown in FIG. 6A is applied after a predetermined time, and the inverter INV outputs the inversion clock signal /CLK as shown in FIG. 6B. while, the multiplexor MUX applies the inversion clock signal /CLK to the first and second counters 8a, 8b as the read control signal RDCON is set as the high level. Here, since the inversion clock signal /CLK is initially at the high level, the first counter 8a starts counting, and thus the first decoder 8c outputs a first column selection signal COLS1 shown in FIG. 6F and similarly the second decoder 8b outputs a first row selection signal ROWS1 shown in FIG. 6I, thereby selecting a first row and a first column of the data buffer 3 and reading the data stored therein.

In other words, the operation of reading the data stored in the data buffer 3 is accomplished in the state where the inversion clock signal /CLK is at the high level which is the initial state and the data which have been read in accordance with such operation are stored in the temporary buffer 10.

Next, when the external clock signal CLK is transited to the high level, the output control unit 82 outputs the output control signal OUTCON shown in FIG. 6L, thereby storing the data which are stored in the temporary buffer 10 in the input/output buffer 4 and then outputting the data to the external circuit.

The input/output buffer 4 is synchronized at a falling edge of the output control signal OUTCON, thus outputting the data to the external circuit. Here, according to the embodiment of the present invention, the data can be stably read without any data collision because the temporary buffer 10 reads and stores the data which are stored in the data buffer 3. Thus, even in the fast data output operation, the flash memory device of the present invention prevents data loss due to the data collision.

On the other hand, when writing external data in a specific cell of the memory array 1, the read control signal RDCON is transited to the low level and thus the multiplexor MUX outputs the external clock signal CLK to the first and second counters 8a, 8b, while the counter control unit 81 resets the first and second counter 8a, 8b at a point where the external clock signal CLK is transited to the high level. The following operation of the flash memory device will be omitted, since it is identical to the general writing operation.

As described above, when the flash memory device according to the present invention performs the read operation, the data which are stored in the data buffer 3 are read and temporarily stored by the temporary buffer 10 which is synchronized with the inversion clock signal /CLK for which the external clock signal CLK is inverted. Therefore, even though the fast reading operation is carried out in accordance with the output control signal OUTCON of the output control unit 82 of the control unit 8, no case where data are lost occurs, thus stably performing the data reading operation.

It will be apparent to those skilled in the art that various modifications and variations can be made in the flash memory device of the present invention without departing from the spirit or scope of the invention. Thus, it is intended that the present invention cover the modifications and variations of this invention provided they come within the scope of the appended claims and their equivalents.

What is claimed is:

1. A flash memory device, comprising:

a memory array consisting of a plurality of flash memory cells;

a sense amp unit amplifying data which are stored in a selected cell of the memory array or amplifying data which are externally applied for storing the data in a selected cell;

a data buffer storing the data amplified by the sense amp unit or storing the eternally applied data;

a temporary buffer receiving and temporarily storing the data which are stored in the data buffer;

an input/output buffer storing data or addresses inputted through input/output pads or receiving and storing data stored in the temporary buffer;

a row buffer receiving and storing row addresses among addresses inputted through the input/output buffer;

a row decoder decoding the row addresses which are inputted to the row buffer for thereby selecting a word line of the memory array;

a column decoder decoding column addresses among addresses inputted through the input/output buffer for thereby selecting a bit line of the memory array; and a control unit controlling the flow of data to and from said data buffer and said temporary buffer.

2. The flash memory device according to claim 1, wherein the control unit comprises:

a first counter synchronized with an external clock signal and thereby performing up-counting to connect the m number of column lines;

a second counter synchronized with the external clock signal and receiving a carry of the first counter and thus performing up-counting in order to select the n number of row lines of the data buffer;

a counter control unit receiving the external clock signal, a counter enable signal and a read control signal and controlling the first and second counters;

a first decoder receiving an output from the first counter and connecting the m number of the column lines with the data buffer;

a second decoder receiving an output from the second counter and thereby selecting the n number of row lines of the data buffer;

an inverter inverting the external clock signal to change a phase thereof;

a multiplexor selectively outputting the external clock signal and an inversion clock signal which is an inverted signal of the external clock signal; and an output control unit outputting an output control signal for latching the data stored in the data buffer at a point where the external clock signal becomes a high level and thus the data are outputted.

3. The flash memory device according to claim 2, wherein the multiplexor controlled by the read control signal outputs the inversion clock signal in a data reading operation and outputs the external clock signal in a data writing operation.

4. The flash memory device according to claim 1, wherein the temporary buffer outputs the data to the input/output buffer in accordance with an output control signal produced by said control unit.

5. The flash memory device according to claim 4, wherein the output control signal has the identical cycle to an external clock signal and a pulse width thereof is smaller than that of the external clock signal.

* * * * *